United States Patent
Graebel et al.

(10) Patent No.: US 7,639,462 B2
(45) Date of Patent: Dec. 29, 2009

(54) METHOD AND SYSTEM FOR REDUCING TRANSIENT EVENT EFFECTS WITHIN AN ELECTROSTATIC DISCHARGE POWER CLAMP

(75) Inventors: Jeffrey Graebel, Plymouth, MN (US); Yifei Zhang, Blaine, MN (US)

(73) Assignee: Honeywell International Inc., Morristown, NJ (US)

( * ) Notice: Subject to any disclaimer, the term of this patent is extended or adjusted under 35 U.S.C. 154(b) by 152 days.

(21) Appl. No.: 11/257,510

(22) Filed: Oct. 25, 2005

(65) Prior Publication Data

US 2007/0091525 A1    Apr. 26, 2007

(51) Int. Cl.
*H02H 9/00* (2006.01)

(52) U.S. Cl. .......................... 361/56; 324/537
(58) Field of Classification Search ................ 361/56; 324/537

See application file for complete search history.

(56) References Cited

U.S. PATENT DOCUMENTS

| | | | |
|---|---|---|---|
| 4,771,230 A * | 9/1988 | Zeh ............................ 324/459 |
| 5,175,605 A | 12/1992 | Pavlu et al. | |
| 5,946,177 A * | 8/1999 | Miller et al. ................... 361/56 |
| 5,956,219 A | 9/1999 | Maloney | |
| 6,388,850 B1 | 5/2002 | Ker et al. | |
| 6,459,553 B1 * | 10/2002 | Drapkin et al. ................. 361/56 |
| 6,690,555 B1 * | 2/2004 | Pasqualini ..................... 361/56 |
| 6,794,908 B2 * | 9/2004 | Erstad .......................... 327/112 |
| 2001/0026192 A1 * | 10/2001 | Yamamoto ................... 330/253 |
| 2004/0113647 A1 * | 6/2004 | Deb et al. ..................... 324/763 |
| 2005/0134295 A1 | 6/2005 | Blumenthal | |

FOREIGN PATENT DOCUMENTS

| | | | |
|---|---|---|---|
| JP | H08-162862 | * | 6/1996 |
| JP | 2004296771 A | * | 10/2004 |

OTHER PUBLICATIONS

Croft, "Transient Supply Clamp with a Variable RC Time Constant", Journal of Electrostatics, Elsevier Science Publishers, vol. 42, pp. 321-331 (1998).

Partial European Search Report for European Patent Application No. 06117724.2.

* cited by examiner

*Primary Examiner*—Rexford N Barnie
*Assistant Examiner*—Nicholas Ieva
(74) *Attorney, Agent, or Firm*—Shumaker & Sieffert, P.A.

(57) ABSTRACT

A method and system for reducing transient event effects, such as radiation effects, in an electrostatic discharge (ESD) power clamp is provided. The ESD power clamp includes triggering circuitry to determine the on-time of the power clamp during an ESD event, and drive circuits driving pull down devices to carry the ESD current. Two separate driver circuits are used to control the pull down circuits separately to guard against a single event effect (SEE). The ESD power clamp operates when both drive circuits are operated simultaneously to shunt the ESD to ground.

7 Claims, 3 Drawing Sheets

METHOD AND SYSTEM FOR REDUCING TRANSIENT EVENT EFFECTS WITHIN AN ELECTROSTATIC DISCHARGE POWER CLAMP

GOVERNMENT RIGHTS

The United States Government has acquired certain rights in this invention pursuant to Contract No. DTRA01-03-D-0018-0001 awarded by the Defense Threat Reduction Agency.

FIELD OF INVENTION

The present invention relates to electrostatic discharge (ESD) power clamps, and more particularly, to ESD power clamps for reducing effects of single event effects (SEE) and for use in a radiation environment, such as for space or military applications, for example.

BACKGROUND

Static charge is an unbalanced electrical charge at rest. Typically, a static charge is created by insulator surfaces rubbing together or pulling apart. One surface gains electrons, while the other surface loses electrons. This results in an unbalanced electrical condition known as the static charge. When a static charge moves from one surface to another, the static charge becomes an electrostatic discharge (ESD). ESD is a miniature "lightning bolt" of charge that moves between two surfaces that have different potentials.

ESD occurs when the voltage differential between the two surfaces is sufficiently high to break down a dielectric strength of the medium separating the two surfaces. When a static charge moves and becomes an ESD, the static charge becomes a current that may damage or destroy gate oxide, metallization, and junctions of circuitry in an integrated circuit, for example. ESD can occur in many ways, for example, a charged body can touch an integrated circuit, a charged integrated circuit can touch a grounded surface, a charged machine can touch an integrated circuit or an electrostatic field can induce a voltage across a dielectric sufficient to break down the dielectric.

ESD events can produce device damage that goes undetected by factory testing, and later, may be the cause of a latent failure in the device. Devices with latent ESD defects are referred to as "walking wounded" because they have been degraded, but not destroyed, by ESD. This occurs when an ESD pulse is not sufficiently strong enough to destroy a device, but nevertheless causes damage. Often, the device suffers junction degradation through increased current leakage or a decreased reverse breakdown, but the device continues to function and is still within data-sheet limits, for example. A device can be subjected to numerous weak ESD pulses, with each successive pulse further degrading a device until a catastrophic failure occurs. There are few practical ways to screen for walking-wounded devices. To avoid this type of damage, devices should be given continuous ESD protection.

To guard against ESD events, integrated circuitry usually is accompanied by an ESD power clamp. Traditional methods of shunting ESD energy to protect circuitry involve devices such as zener diodes, metal oxide varistors (MOVs), transient voltage suppression (TVS) diodes, and regular complementary metal oxide semiconductor (CMOS) or bipolar clamp diodes. However, many of these devices are subject to "glitches," which include unwanted transitions of a signal from a first voltage state to another, and then back to the first voltage state.

Glitches may be caused by many factors including radiation effects. As such, many circuits are designed to include a level of "radiation hardness," i.e., an attribute of a circuit indicating the extent to which the circuit can withstand nuclear or other radiation. Integrated digital circuits used in space, weapons, or aviation applications are typically designed to be more resistant to radiation than circuits used in other applications, because they are more likely to be exposed to radiation, and because their reliability is often more critical, for example. However, such solid-state circuits may still be vulnerable to radiation effects, such as disturbances caused by single, charged particles present within an ambient environment of the circuit, such as alpha particles (e.g., byproducts of the natural decay of elements such as uranium and thorium present in some integrated circuit packaging materials) or energetic protons, neutrons, electrons, heavy ions, and all the natural elements (e.g., these are abundant in intergalactic space, earth orbital space and even at high atmospheric or commercial flight altitudes in a wide range of energies).

When a charged particle passes through a transistor (or any active electronic device), the particle loses energy by ionizing the medium through which the particle passes, leaving behind a track of hole-electron pairs. The electrons of the pairs will migrate toward high voltage state nodes of the struck transistor, resulting in a discharging current on that node. If the discharging current exceeds the current drive of the transistor holding the high voltage state on that node, the node will transition to an undesired low state. Conversely, the holes of the pairs will migrate toward low voltage state nodes of the struck transistor resulting in a charging current on that node. If the charging current exceeds the current drive of the transistor holding the low voltage state on that node, the node will transition to an undesired high state. The number of hole-electron pairs created by the particle is finite, so the node voltage disturbance is temporary.

Particle-induced circuit disturbances are random and are commonly referred to as single-event effects (SEEs). The SEEs can take on many forms. If the particle strike results in a bit flip or other form of corruption of stored data, this is known as a single-event upset (SEU), or a soft error. If the particle causes a transient voltage disturbance on a node of a logic circuit, this is known as a single-event transient (SET).

A circuit node will typically return to a desired voltage state after an SET. Thus, an SET, in and of itself, may not be a problem. What is likely to be a problem is the consequence of having a temporary voltage disturbance on a circuit node. As an example, if the node is in an ESD circuit, the disturbance may cause the ESD power clamp to operate incorrectly, and possible allow an ESD to transfer through the circuitry for which the ESD power clamp was designed to protect. Alternatively, the circuitry may be inadvertently triggered if the ESD circuit turns on at a time when system power is applied causing improper operation of the circuitry.

The susceptibility of ESD power clamps to SEEs can be heightened by reduced feature sizes of integrated circuits and higher clock speeds. As feature sizes continue to decrease, SEEs may become more likely to propagate through logic gates as normal logic pulses, causing upsets within logic circuits.

Existing ESD power clamps do not consider possible SEEs. Thus, it is desirable to improve ESD power clamp immunity against an SEE caused by radiation so that a system with ESD power clamp protection may function reliably in a radiation environment.

SUMMARY

Within embodiments disclosed below, an electrostatic discharge (ESD) power clamp is presented that may be operated in radiation environments. The ESD power clamp includes ESD suppression circuitry to detect an ESD and to shunt the ESD to ground, and single event effect (SEE) protection circuitry to suppress a non-ESD transient event that may be experienced by the ESD suppression circuitry such that the ESD suppression circuitry maintains proper operation while experiencing the transient event, so as to avoid a false or inadvertent triggering of circuitry.

In another embodiment, the electrostatic discharge (ESD) power clamp may include triggering circuitry to detect an ESD, and ESD suppression circuitry coupled to the triggering circuitry and including multiple switches that operate independently, such that upon detection of the ESD by the triggering circuitry the ESD suppression circuitry shunts the ESD to ground only when both switches activate simultaneously.

In another embodiment, a method of hardening against single event effects (SEE) within an electrostatic discharge (ESD) power clamp is provided. The method includes providing a discharge path including a first switch and a second switch connected in series. The method also includes providing a first activation signal to the first switch in order to activate the first switch and providing a second activation signal to the second switch in order to activate the second switch. The method further includes operating the first switch and the second switch simultaneously to shunt an ESD to ground through the discharge path so that in the event that the ESD power clamp experiences a transient event such that one of the first switch or the second switch erroneously activates, the ESD power clamp suppresses the transient event.

These and other aspects will become apparent to those of ordinary skill in the art by reading the following detailed description, with reference where appropriate to the accompanying drawings. Further, it should be understood that the embodiments noted herein are not intended to limit the scope of the invention as claimed.

DETAILED DESCRIPTION

Electrostatic discharge (ESD) protection is a common requirement on any circuit. In a satellite environment, where radiation effects occur, commercial power clamps may be vulnerable due to particles flying through space that may adversely affect operation of the power clamp. The present application describes an on-chip resistor/capacitor (RC) triggered power supply clamp used for electrostatic discharge (ESD) protection in a heavy ion or proton radiation environment. The ESD power clamp is designed to reduce effects due to single event effects (SEE) caused by the radiation so that the system with the on-chip power clamp protection can function reliably in the radiation environment, for example.

Figure 1:
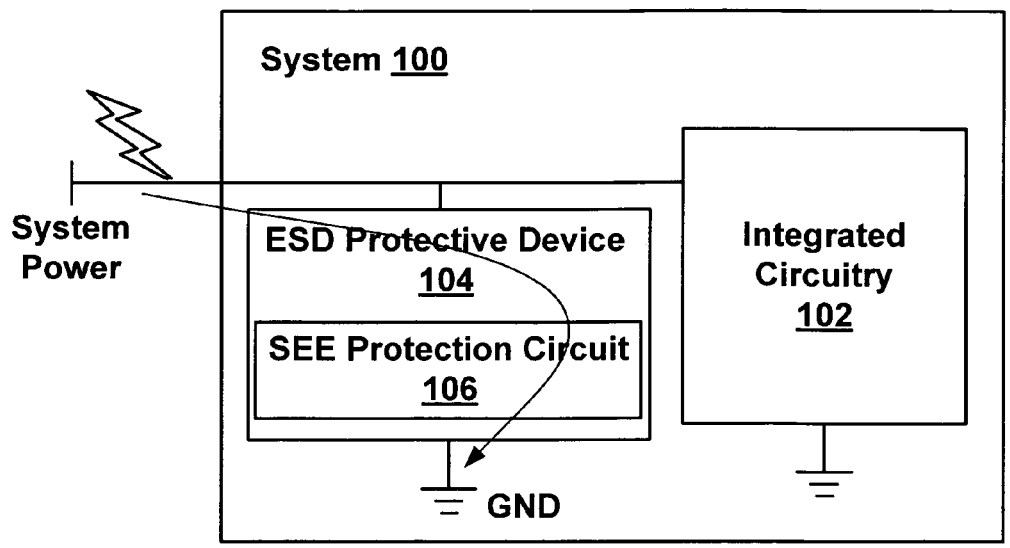
FIG. 1 illustrates one example of a system providing ESD protection for an integrated circuit within a radiation environment.

Referring now to the figures, FIG. 1 illustrates one example of a system 100 providing ESD protection for an integrated circuit 102 within a radiation environment. The system 100 includes an ESD protective device 104 including an SEE protection circuit 106 coupled to the integrated circuit 102. The system 100 is intended to protect an electronic circuit or the integrated circuitry 102 connected between a source of supply voltage and ground (GND) from voltage spikes. The ESD protective device 104 ensures a low impedance path from the positive supply to the negative supply (GND) during a positive polarity ESD pulse applied to the input of the integrated circuitry 102. The SEE protection circuit 106 within the ESD protective device 104 operates to suppress any SET or non-ESD transient events that occur within the ESD protective device 104.

Figure 2:
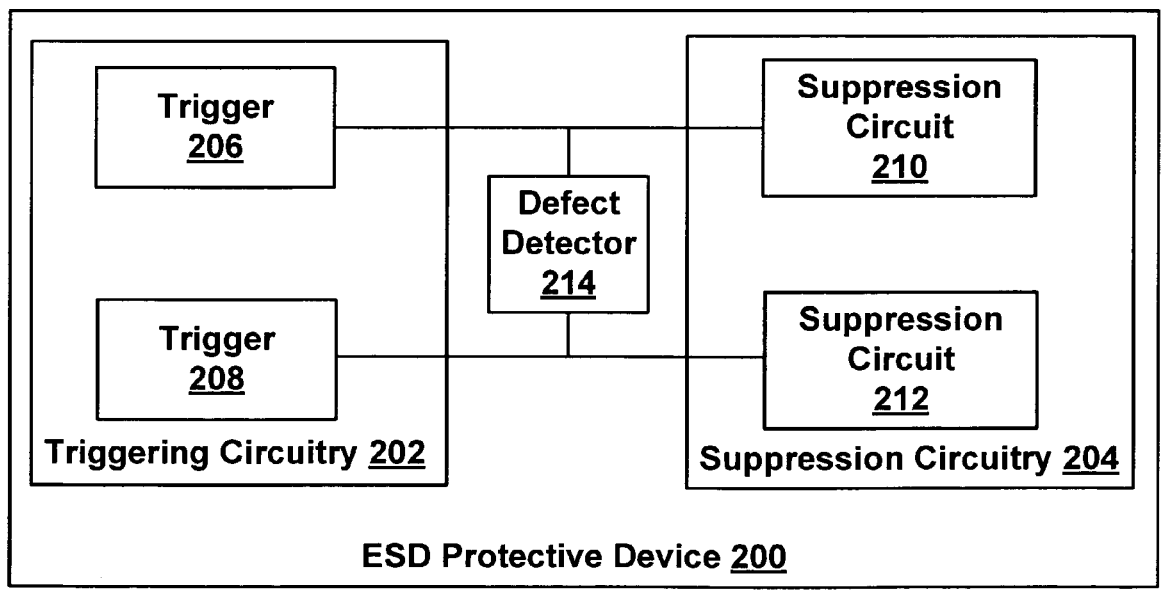
FIG. 2 is a block diagram illustrating one embodiment of the ESD protective device.

FIG. 2 is a block diagram illustrating one embodiment of the ESD protective device 200. The ESD protective device 200 includes triggering circuitry 202 for detecting an ESD coupled to suppression circuitry 204 for eliminating the ESD. The ESD protective device 200 includes dual triggers 206 and 208 coupled to suppression circuits 210 and 212, respectively, so that each of suppression circuits 210 and 212 is triggered simultaneously, yet independent of each other. The ESD protective device 200 further includes a defect detector 214 coupled to the triggering circuitry 202 and the suppression circuitry 204 for detecting any manufacturing defects within the ESD protective device 200, for example.

Figure 3A:
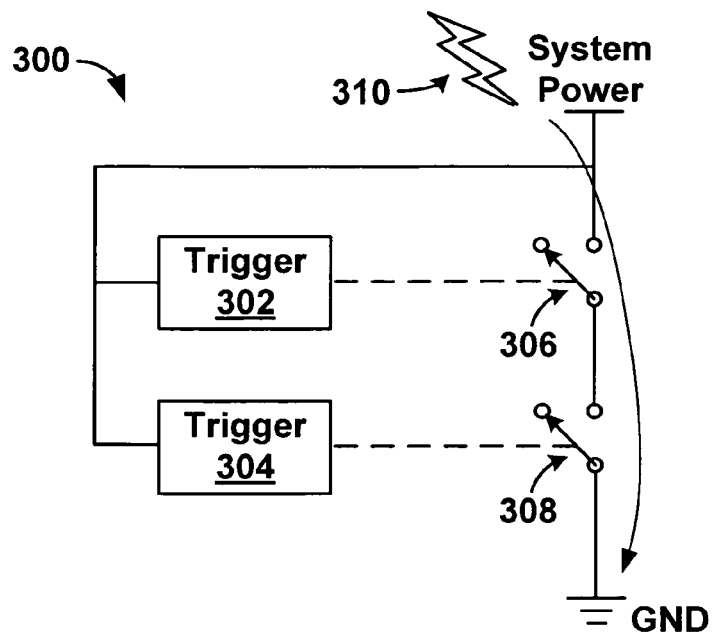
FIG. 3A is block diagram illustrating another embodiment of the ESD protective device.

FIG. 3A is a circuit diagram illustrating one embodiment of an ESD protective device 300. The device 300 includes triggers 302 and 304 to operate switches 306 and 308, such that in the event of an ESD 310, the triggers will close switches 306 and 308 thereby providing a path for the ESD 310 to ground. Each of the switches 306 and 308 must be operated simultaneously in order to shunt the ESD 310 to ground.

Figure 3B:
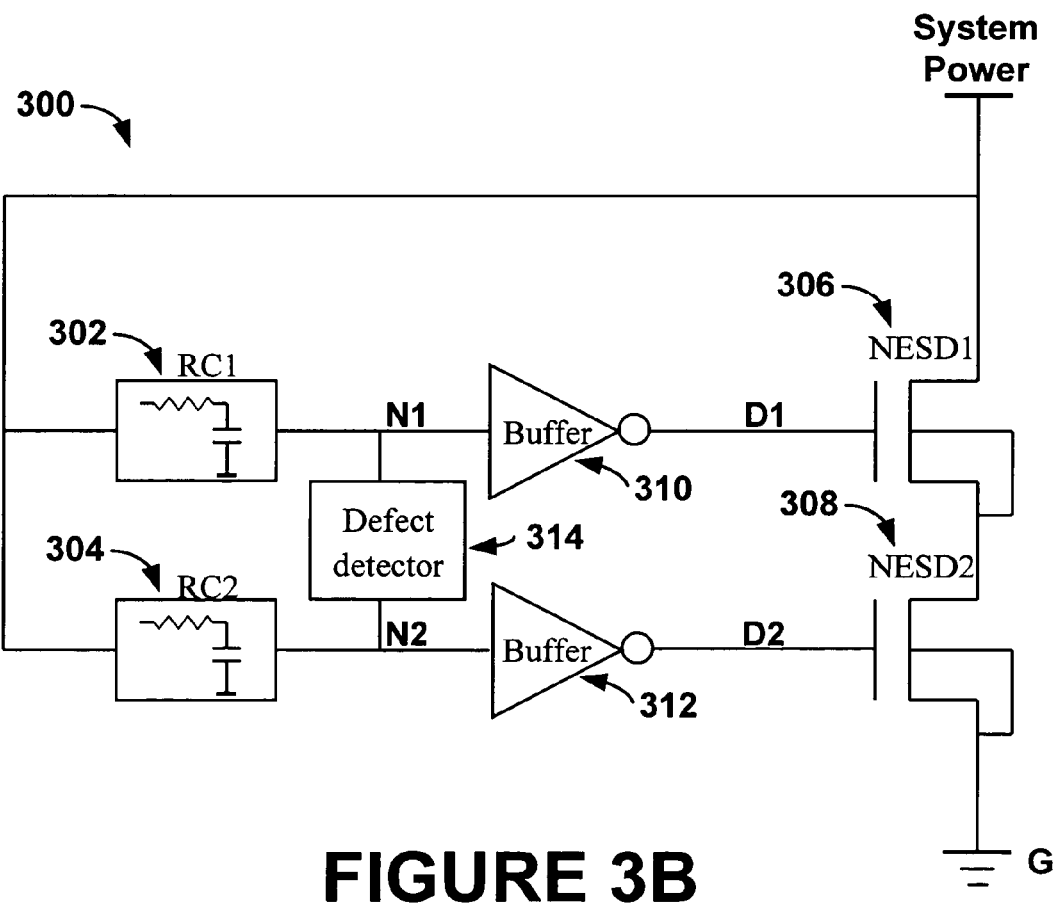
FIG. 3B illustrates a circuit diagram of one example of the ESD protective device.

FIG. 3B illustrates a circuit diagram of the ESD protective device 300. The triggers 302 and 304 include RC circuits (RC1 and RC2), which are coupled through buffers (e.g., invertors) 310 and 312 to the switches 306 and 308. In this diagram, the switches 306 and 308 are illustrated as N-type MOSFETs. The stacked switches 306 and 308 are arranged with the body terminal of the devices connecting to the source terminal in an SOI process to achieve good immunity against SEE, for example. Further, the drain terminal of the switch 306 is connected to system power, the drain terminal of switch 308 is connected to the source terminal of switch 306, and the gate terminals of the switches are connected to outputs of the buffers 310 and 312, respectively.

Of course, as an alternate design, the N-type MOSFETs can be replaced with P-type MOSFETs and the inverters 310 and 312 can be removed in order to operate the ESD protective device 300 in the same manner. Still, as a further alternate design, the N-type MOSFETs can be replaced with P-type MOSFETs and the inverters 310 and 312 can be replaced by non-inverting buffers to operate the ESD protective device 300 in the same manner, so as to reduce loading on the RC networks, for example.

As such, the ESD protective device includes three circuit sections; RC networks for identifying that an ESD event is occurring and determining the on-time of the power clamp during the ESD event, drive circuits for controlling the switches to carry the ESD current, and pull down devices (N-type MOSFET) for carrying the ESD current.

Two separate driver circuits (e.g., RC circuits 302 and 304) are used to drive the stacked pull down circuits separately to guard against an SEE (described more fully below). The RC circuits may include any combination of resistors and capacitors as desired for a particular application. Selection of the values for the resistances and capacitors may be controlled by the product RC (resistance×capacitance) or the time constant (τ) (e.g., generally, after five RC time constants, the capacitor is almost completely charged or discharged).

In operation, when an ESD is experienced, a large voltage spike will be seen at the inputs of the RC networks 302 and 304. If the values of the resistors and capacitors are chosen such that the time constant is larger or much larger than the time elapsed during an ESD (ESD pulses are characterized by very-fast rise times), then the capacitors will not charge during the ESD, thus holding the voltage of nodes N1 and N2 low during the ESD. Nodes D1 and D2 will then be high so that the switches NESD1 and NESD2 will be in conduction mode and absorb the ESD current, passing it to ground.

In normal operation when no ESDs are present, with a slow rise in system power, the RC networks will track with the power supply if the time constant is less than or much less the rise time of the power supply holding nodes N1 and N2 high resulting in nodes D1 and D2 being low such that transistors never turn on. For example, if the time constant is about ten times less than the rise time of the power supply, unintentional current stemming from a normal turn on of system power can be minimized.

If an SEE occurs (a particle strikes one of the transistors 306 or 308 and turns it on), the ESD protective device 300 will still operate as desired since both transistors have to be turned on simultaneously to shunt the power to ground. The chances of particles striking each transistor 306 and 308 causing an SEE event at both transistors simultaneously are extremely low and very unlikely to occur during a radiation event. Further, as shown below in FIG. 5, implementing the switches using many transistors in parallel essentially makes the occurrence of simultaneous radiation events insignificant. Thus, any one transistor hit will not hurt operation of the ESD protective device 300.

The ESD protective device 300 may include one or more sets of triggers and switches to provide another layer of SEE protection. For example, if the ESD protective device 300 included one more trigger and switch set, with the additional switch connected in series with switches 306 and 308, all three switches would need to be operated simultaneously in order to shunt an ESD to ground. Thus, if a particle happened to strike one or two of the switches at the same time, the ESD power clamp would still operate properly.

The ESD protective device 300 further includes a defect detector 314 to identify defects within the device prior to operation of the device 300. For example, from a manufacturing point of view, when the ESD protective device 300 is produced, it needs to be tested to determine if both triggering circuits are fully functional or if one has a defect. The defect detector 314 essentially detects any resistive shorts in one of the RC circuits.

For example, to meet the circuit layout constraint and to have an adequate RC constant for an ESD event, normally a value of the resistors in the RC networks is in the range of mega-ohms and a value of the capacitors in the RC networks is in the range of pico farads. Defects in a capacitor of one of the RC networks can cause a resistive short and bring one of the internal nodes N1 or N2 down when the device is powered. As a result, one of the parallel paths in the ESD protective device 300 will be on (e.g., N-type MOSFET 306 or 308 will be conducting) and the suppression technique for suppressing a radiation transient event will no longer function as designed. In this instance, a leakage current limited by the resistor is small (e.g., less than about 10 uA) and is not usually detected by a manufacture screening process (e.g., at typical screening process normally requires about 100 uA to detect a defect).

Figure 4:
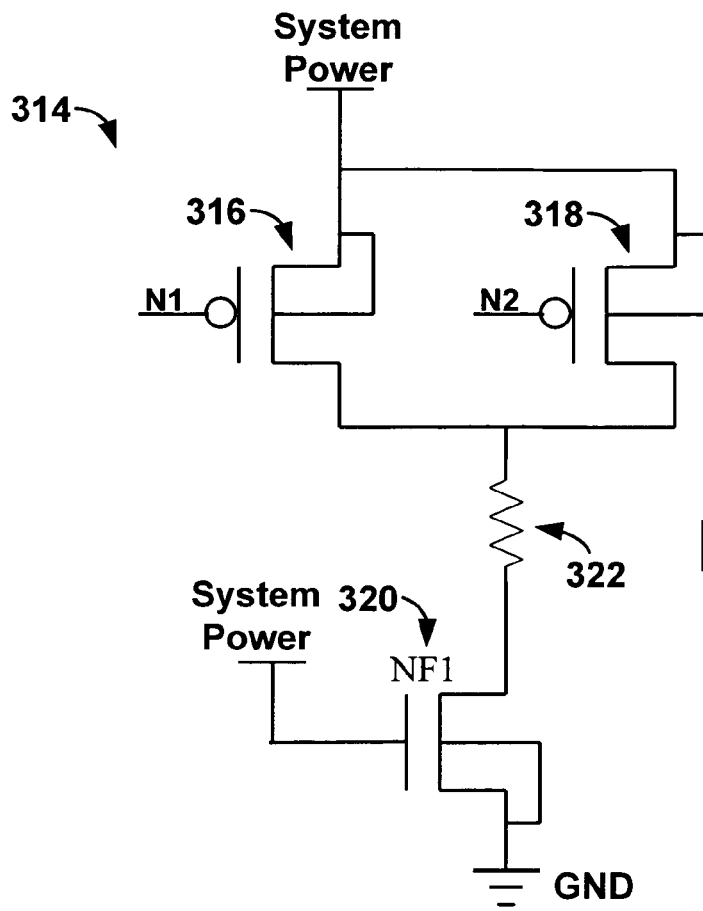
FIG. 4 illustrates one example of a defect detector within the ESD protective device.

One purpose of the defect detector 314 is to supplement the leakage current of the resistor during a test without adding much layout area in order to detect if one of the nodes (N1 or N2) goes down. FIG. 4 illustrates one example of the defect detector 314. As shown, the defect detector 314 includes P-type MOSFETs 316 and 318, and N-type MOSFET 320. The gate of transistor 320 (NF1) is tied to the system power and is always on. The transistor 320 combined with a resistor 322 set the current for the screening and perform similar to a current source. If either of N1 or N2 is low enough, the P-type transistors 316 or 318 will be on and will trigger a static current to flow from power to ground. By measuring leakage current through the defect detector 314, defects within the RC networks can be identified.

Figure 5:
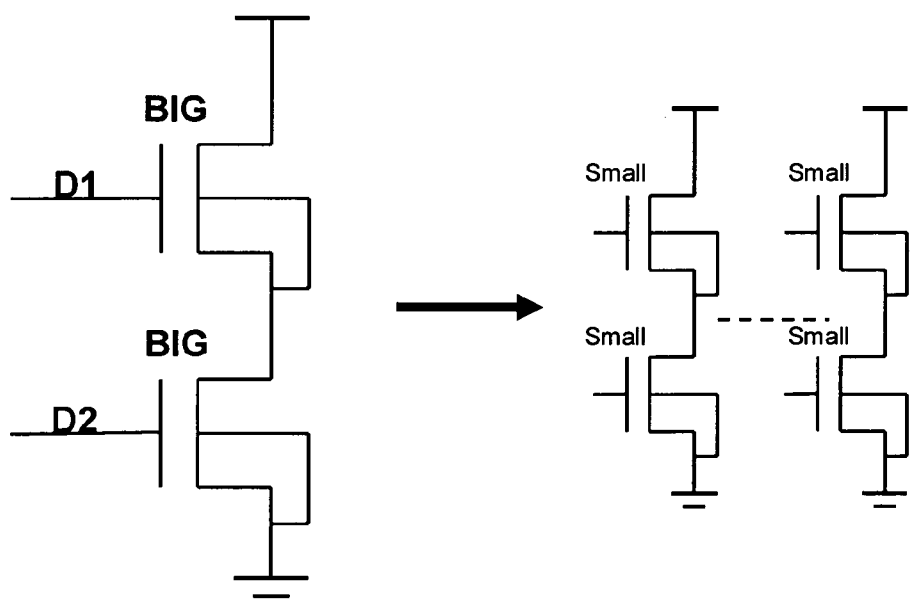
FIG. 5 illustrates an example of a parallel transistor structure design for the ESD protective device.

The transistors of the ESD protective device 300 can be large transistors, and when triggered, the transistors may draw a high amount of current. To lessen unintended current draw, each transistor can be broken into smaller parallel structures, as shown in FIG. 5. With a parallel structure design, if a particle strikes a transistor, that transistor will be limited in an ability to draw current due to its smaller design. The parallel structure design will still use the same amount of transistor area as the transistors (e.g., could have up to about 100 legs), and the parallel transistors, when all triggered, will draw the same current as the single wide transistor, however, as noted, the reduction of unintended currents due to transients or defects in individual transistors that do not simultaneously effect every transistor can be realized.

The dual triggering and switching mechanism of the ESD protective device 300 also provides a fail safe method for operating the device. For example, once the device is implemented in the field, it is desirable to have the device operate properly as long as possible, so that if half the device fails, it would be advantageous if the circuit as a whole still operated properly. With the parallel design, a failure in one leg does not affect operation of the device as an ESD protective circuit. For instance, if one of the RC circuits or transistors fails, the device will still operate as an ESD protective device to shunt an ESD to ground even though in this event, the device may have some vulnerability to radiation. Further, if one leg fails, the remaining leg will not draw a high current and damage the circuit that it protects.

It is intended that the foregoing detailed description be regarded as illustrative rather than limiting, and it is intended to be understood that the following claims including all equivalents define the scope of the invention.

What is claimed is:

1. An electrostatic discharge (ESD) power clamp comprising:

ESD suppression circuitry to detect an ESD and to shunt the ESD to ground, wherein the ESD suppression circuitry comprises a first switch and a second switch operable to shunt the ESD to the ground;

single event effect (SEE) protection circuitry coupled to the ESD suppression circuitry to suppress a non-ESD transient event that may be experienced by the ESD suppression circuitry such that the ESD suppression circuitry maintains proper operation while experiencing the transient event, wherein the SEE protection circuitry includes a first triggering circuit coupled to the first switch of the ESD suppression circuitry and a second triggering circuit coupled to the second switch of the ESD suppression circuitry in order to operate the first switch and the second switch independently; and a defect detector coupled to the ESD suppression circuitry and the SEE protection circuitry to detect manufacturing defects of the ESD power clamp, wherein the defect detector comprises a first P-type transistor having a gate receiving an output of the first triggering circuit, a second P-type transistor having a gate receiving an output of the second triggering circuit, and a current source, wherein if an output from one of the first or second triggering circuits is below a threshold level, of an output of the first P-type transistor or an output of the second P-type transistor results in a signal indicating a defect.

2. The ESD power clamp of claim 1, wherein the first switch and the second switch are connected in series between a positive supply voltage and ground.

3. The ESD power clamp of claim 1, wherein the first and second triggering circuits each include a resistor/capacitor (RC) network.

4. The ESD power clamp of claim 3, wherein if a capacitor in the RC network has a defect, the defect detector supplements a leakage current of a resistor in the RC network to produce a measurable current so that defects within the RC network can be identified.

5. The ESD power clamp of claim 3, wherein a time constant of the RC network is less than a rise time of a power source to which the ESD power clamp is connected.

6. The ESD power clamp of claim 1, wherein the first triggering circuit causes the first switch to be non-conducting, unless if an ESD is experienced the first triggering circuit outputs a signal causing the first switch to be in a conduction mode to conduct the ESD, and wherein the second triggering circuit causes the second switch to be non-conducting, unless if an ESD is experienced the second triggering circuit outputs a signal causing the second switch to be in a conduction mode to conduct the ESD, wherein when both the first switch and the second switch are in the conduction mode, the ESD will be shunted to ground.

7. The ESD power clamp of claim 1, wherein the first switch and the second switch comprise N-type MOSFETS arranged with a body terminal connected to a source terminal.

* * * * *

UNITED STATES PATENT AND TRADEMARK OFFICE
CERTIFICATE OF CORRECTION

| | | |
|---|---|---|
| PATENT NO. | : 7,639,462 B2 | Page 1 of 1 |
| APPLICATION NO. | : 11/257510 | |
| DATED | : December 29, 2009 | |
| INVENTOR(S) | : Jeffrey Graebel et al. | |

It is certified that error appears in the above-identified patent and that said Letters Patent is hereby corrected as shown below:

Col. 7, Line 12 (Claim 1), "level, of an output" should be --level, an output--

Signed and Sealed this
Third Day of May, 2011

David J. Kappos
*Director of the United States Patent and Trademark Office*